(12) United States Patent
Roohparvar et al.

(10) Patent No.: US 6,870,774 B2
(45) Date of Patent: Mar. 22, 2005

(54) FLASH MEMORY ARCHITECTURE FOR OPTIMIZING PERFORMANCE OF MEMORY HAVING MULTI-LEVEL MEMORY CELLS

(75) Inventors: Frankie F. Roohparvar, Monte Sereno, CA (US); Kevin C. Widmer, San Carlos, CA (US); Cliff Zitlaw, San Jose, CA (US)

(73) Assignee: Micron, Technology, Inc., Boise, ID (US)

( * ) Notice: Subject to any disclaimer, the term of this patent is extended or adjusted under 35 U.S.C. 154(b) by 147 days.

(21) Appl. No.: 10/315,323

(22) Filed: Dec. 10, 2002

(65) Prior Publication Data

US 2004/0109358 A1 Jun. 10, 2004

(51) Int. Cl.[7] .............................................. G11C 16/04
(52) U.S. Cl. .......................... 365/185.33; 365/185.03; 365/196
(58) Field of Search ...................... 365/185.33, 185.03, 365/185.12, 196

(56) References Cited

U.S. PATENT DOCUMENTS

| | | | |
|---|---|---|---|
| 6,122,193 A * | 9/2000 | Shibatà et al. ......... | 365/185.03 |
| 6,209,113 B1 | 3/2001 | Roohparvar ............... | 714/773 |
| 6,275,417 B1 | 8/2001 | Lee et al. ............... | 365/185.19 |
| 6,279,133 B1 | 8/2001 | Vafai et al. ............. | 714/763 |
| 6,304,484 B1 | 10/2001 | Shin et al. ............. | 365/185.03 |
| 6,307,783 B1 | 10/2001 | Parker ................. | 365/185.21 |
| 6,314,049 B1 | 11/2001 | Roohparvar ............... | 365/233 |
| 6,327,202 B1 | 12/2001 | Roohparvar ............... | 365/203 |
| 6,377,497 B2 | 4/2002 | Sato .................... | 365/196 |
| 6,606,269 B2 * | 8/2003 | Roohparvar ........... | 365/185.33 |
| 2001/0040826 A1 | 11/2001 | Lakhani ................. | 365/185.22 |
| 2001/0052102 A1 | 12/2001 | Roohparvar .............. | 714/773 |

OTHER PUBLICATIONS

Micron Technology, Inc. Technical Note Titled: "SyncFlash Memory—A High–Speed Synchronous Flash Device," TN–28–31, originally published in 2000.
Micron Technology, Inc. SyncFlash Overview; internet printout dated Apr. 24, 2002.
Micron Technology, Inc. product specification for the SyncFlash Memory, published Sep. 2001.
Micron Technology, Inc. internet printout Data Sheet for the 4 Meg ×16 SyncFlash Memory dated Apr. 24, 2002.

* cited by examiner

Primary Examiner—Richard Elms
Assistant Examiner—Toan Le
(74) Attorney, Agent, or Firm—Wong, Cabello, Lutsch Rutherford & Brucculeri, LLP

(57) ABSTRACT

A flash memory device having a pipelined RAS/CAS architecture is logically organized as an array of rows and columns of multi-bit flash memory cells each capable of being selectively programmed to have a threshold voltage corresponding to one of a plurality of multi-bit bit-sets. In one embodiment, the memory device is adapted to perform a burst read operation in which a row of flash memory cells is sensed and latched and subsequently outputted from the device on consecutive clock cycles following a sense latency period. In accordance with one aspect of the invention, the pipelined architecture allows for a second burst read operation to be initiated prior to completion of the first, such that the sense latency periods for all but the first of a series of successive burst read operations are hidden, enabling the memory device to perform comparably to a memory device having conventional flash memory cells.

19 Claims, 10 Drawing Sheets

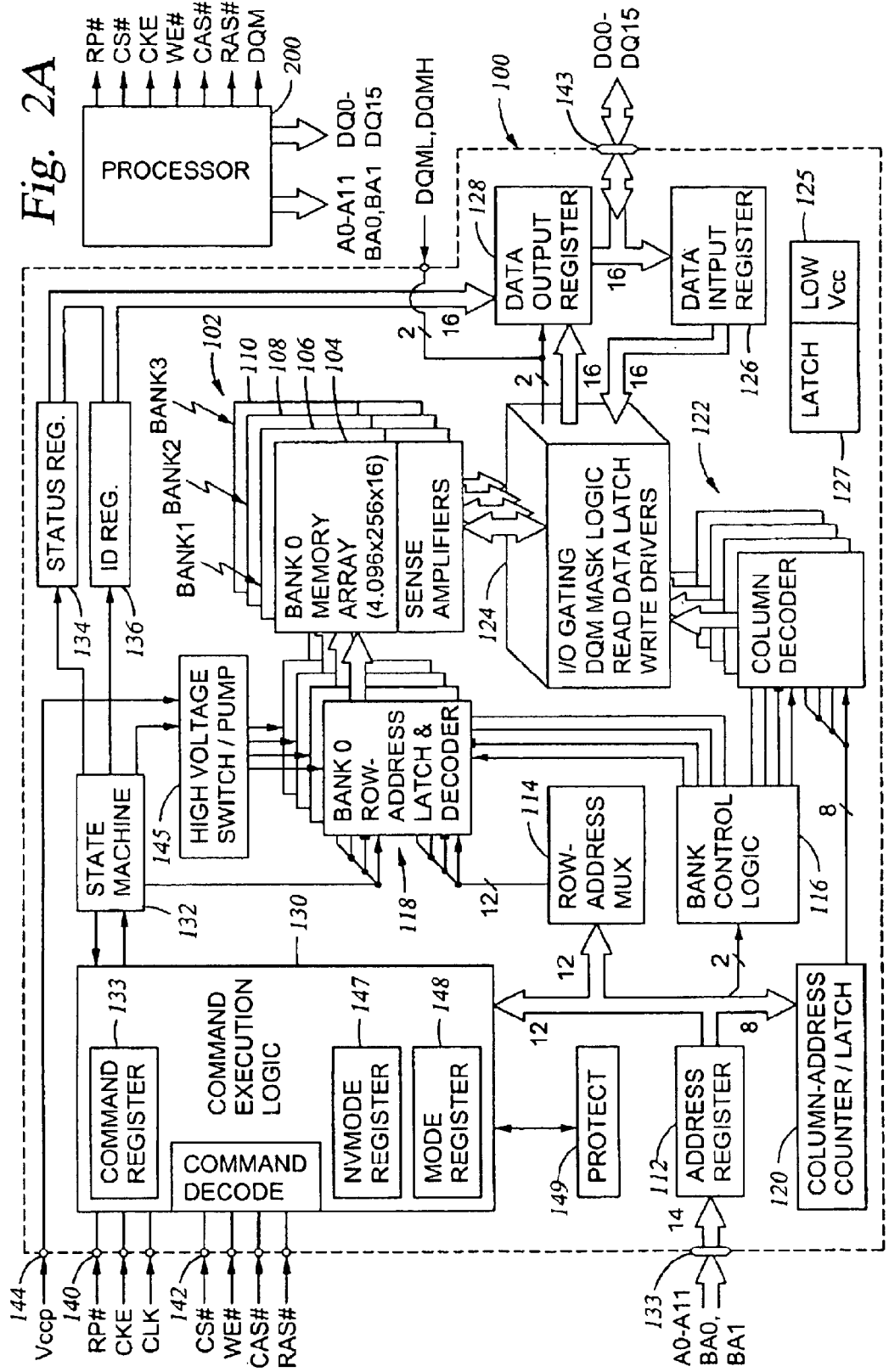

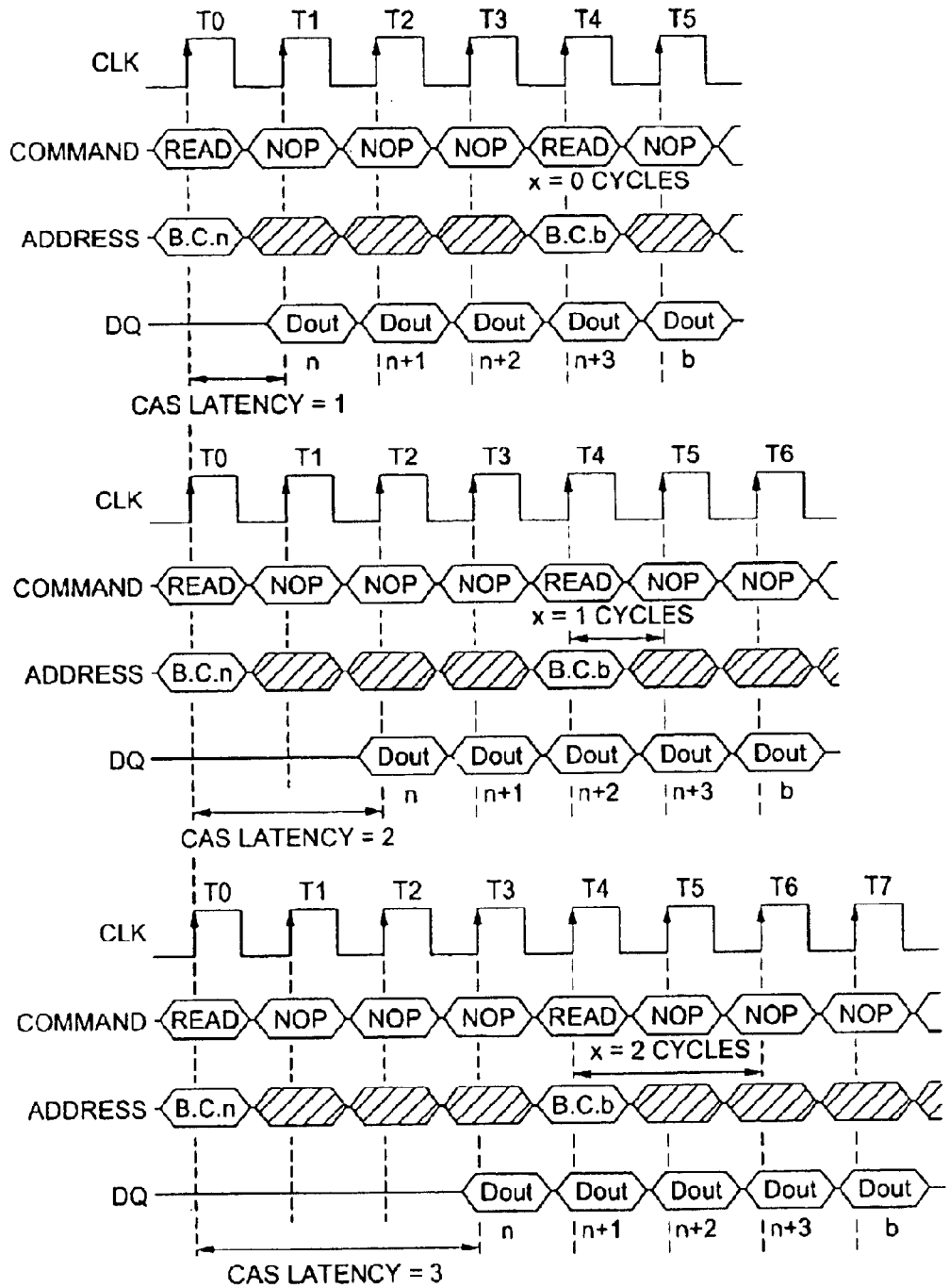
  DON'T CARE

FLASH MEMORY ARCHITECTURE FOR OPTIMIZING PERFORMANCE OF MEMORY HAVING MULTI-LEVEL MEMORY CELLS

FIELD OF THE INVENTION

This invention relates generally to semiconductor devices, and more particularly relates to flash memory devices.

BACKGROUND OF THE INVENTION

Electrically erasable and programmable memory devices having arrays of what are known as flash memory cells are found in a wide variety of electrical devices. A flash cell, also called a floating gate transistor memory cell, is similar to a field effect transistor, having a channel region between a source and a drain and a control gate over the channel region. In addition the flash cell has a floating gate between the control gate and the channel region. The floating gate is separated from the channel region by a layer of gate oxide, and an interpoly dielectric layer separates the control gate from the floating gate. Both the control gate and the floating gate are formed of doped polysilicon. The floating gate remains floating or electrically isolated. A flash cell is programmed by applying appropriate voltages to the control gate, the drain, and the source, causing electrons to pass from the channel region to the floating gate through the gate oxide. The voltage applied to the control gate, called a programming voltage, determines the amount of charge residing on the floating gate after programming, and the charge determines the voltage that must be applied to the control gate in order to allow the flash cell to conduct current between the source and the drain. This voltage is termed the threshold voltage of the flash cell, and is the physical form of the data stored in the flash cell. As charge is added to the floating gate the threshold voltage of the flash cell increases.

Those of ordinary skill in the art will appreciate that a read operation from a flash memory device can be considered to comprise two sequential stages. The first stage is a latch stage where the voltage level stored in the flash cell is sensed by sense amplifiers and latched into a buffer. The second stage is an output stage where the data latched in the buffer is output to the data output (DQ) pins of the device. With conventional flash memory architectures, the latch stage of a read operation involves sensing the state of an entire row of memory locations and latching the sensed values in a latch. This occurs in response to assertion of a "READ" signal. The data is available at the memory device's output pins some time after the READ signal has been asserted.

The earliest flash memory devices were primarily asynchronous devices, meaning that no external clocking signal was required for their operation. The primary significant timing constraint for an asynchronous flash memory is a latency period following assertion of the READ command before the data was available at the output (DQ) pins.

Later, synchronous flash memories were introduced. A synchronous flash memory operates (or appears from external to the device to operate) in essentially the same manner as a conventional synchronous dynamic access memory (SDRAM). Data is read from a synchronous flash memory by first asserting a row address strobe (RAS) signal to latch in a row address applied to the address inputs of the device, and subsequently asserting a column address strobe (CAS) signal to latch in a column address of the memory location to be accessed. Both RAS and CAS are asserted in a specified timed relationship with a clock signal (CLK) defining the operational speed of the memory device. A latency period following assertion of the CAS signal, measured in terms of some number of clock cycles, must elapse before valid data stored at the addressed location is available at the device's DQ output pins.

Examples of synchronous flash memory devices such as described generally above include the SynchFlash® family of synchronous flash memory devices commercially available from Micron Technology, Inc., Boise, Id. (the Assignee of the present invention). Memories in the SynchFlash® family feature SDRAM-compatible interfaces (pinouts) and timing specifications. Synchronous flash memory architectures are also disclosed in detail in U.S. Pat. No. 6,314,049 to Roohparvar, entitled "Elimination of Precharge Operation in Synchronous Flash Memory," and in U.S. Pat. No. 6,327,202 to Roohparvar, entitled "Bit Line Pre-Charge in a Memory." The aforementioned '049 and '202 patents are commonly assigned to the Assignee of the present invention and are hereby incorporated by reference herein in their respective entireties.

As an improvement over conventional flash memories, it has been proposed in the prior art to utilize multi-bit flash memory cells (alternatively referred to as multi-level or multi-state flash cells) in a flash memory to improve the capacity of the memory and the speed with which data can be read from and written to the memory. A multi-bit or multi-state flash cell is a flash memory cell for which multiple, distinct threshold voltage levels are defined over a voltage range within the flash cell. Each distinct threshold voltage level corresponds to a set of data bits, with the number of bits representing the amount of data which can be stored in the multi-state flash cell. This method allows multiple bits of binary data to be stored within a single flash cell. When reading the state of the flash cell, the threshold voltage level for which the flash cell conducts current corresponds to a bit set representing data programmed into the flash cell.

A multi-state flash cell is programmed by applying a programming voltage to the control gate and holding the drain to a constant voltage over a proper time period to store enough charge in the floating gate to move the threshold voltage of the flash cell to a desired level. This threshold voltage level represents a state of the flash cell corresponding to the data (bit set) stored in the flash cell.

An example of a prior art flash memory device having multi-state memory cells is disclosed in U.S. Pat. No. 6,209,113 to Roohparvar, entitled "Method and Apparatus for Performing Error Correction on Data Read from a Multistate Memory." The '113 patent is commonly assigned to the Assignee of the present invention and is hereby incorporated herein by reference in its entirety.

Those of ordinary skill in the art will appreciate that for a multi-state memory cell, the latch stage of a read cycle is inherently slower compared with single-bit flash memory cells, due mainly to the time that is required to "resolve" the voltage on each cell. (Those of ordinary skill in the art will understand that to "resolve" the voltage on a flash memory cell involves sensing the voltage stored in the cell and translating that voltage into one of a plurality of bit-sets defined for that cell.) That is, a higher resolution of sensing is required to distinguish between the multiple logic levels, thus requiring more sensing time as compared with single-bit flash memory cells. Often, two separate sense amplifiers are involved in resolving the voltage level stored in a multi-level cell. However, once the latching stage is complete for an addressed row of cells, the outputting stage of a read operation is essentially the same for 1 bit-per-cell as for 2 (or more) bits-per-cell.

FIG. 1a illustrates the cell data map for a conventional one-bit-per-cell flash memory cell. As shown in FIG. 1a, two separate levels or ranges are defined within the overall flash cell Vthreshold range. When reading from such a flash cell, all that is necessary is to determine whether the threshold voltage is above or below the midpoint between the two levels. Voltages in one level are interpreted as a single binary bit (zero or one) while voltages in the other level are interpreted as the complementary binary bit (one or zero).

FIG. 1b on the other hand illustrates the cell data map for a multi-level flash memory cell capable of storing two bits. As can be seen in FIG. 1b, the data map defines four separate ranges or levels (Levels 0, 1, 2, and 3) within the range of the cell's overall maximum Vthreshold. Each level is assigned a two-bit pair or bit-set, 0,0, 0,1, 1,0, or 1,1. The advantages of such multi-level cells are well known and appreciated by those of ordinary skill in the art. The perceived disadvantage of multi-level cells is that the time to resolve the correct voltage level is generally longer than for conventional flash memory cells. One possible approach to sensing a multi-level cell such as represented by the map of FIG. 1b is to first sense whether the threshold voltage is above or below the boundary between Level 1 and Level 2, and next ascertain whether the threshold voltage is above or below the boundary between Level 0 and Level 1 or between Level 2 and Level 3 (depending upon the outcome of the first sensing phase). In implementation, such an approach can require two sense amplifiers per cell, and the overall sensing process can take substantially longer than for sensing a conventional flash cell. (The sensing process for multi-level cells can possibly be accelerated at the expense of sensing accuracy; however, this can necessitate additional error correction circuitry for the memory.)

SUMMARY OF THE INVENTION

In view of the foregoing considerations, the present invention is directed to a flash memory device, and to a corresponding method of operating a flash memory device.

In one embodiment of the invention, a flash memory device comprises a plurality flash memory cells logically arranged as an array of rows and columns, with each column organized as a plurality of multi-bit words. In accordance with one aspect of the invention, the flash memory cells are of the multi-level or multi-bit variety, capable of being programmed to have threshold values corresponding to any of a plurality of multi-bit bit-sets. In a particular embodiment of the invention, for example, the flash memory cells are two-bit memory cells for which four separate threshold voltage ranges corresponding to the bit-sets (0,0), (0,1), (1,0) and (1,1) are defined.

In accordance with another aspect of the invention, the flash memory device is implemented with a pipelined, RAS/CAS architecture and is operable in a burst mode of operation in which data in a given row of the memory array is outputted in a burst of successive words synchronized to an externally-applied clock signal.

In accordance with another aspect of the invention, following initiation of a first burst read operation, but before completion thereof, a second burst read operation may be initiated, such that upon completion of the first burst read operation, the second burst read operation has advanced to the internal latching phase, such that the sensing latency associated with multi-level flash memory cells is avoided.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein:

FIG. 2a is a simplified block diagram of a synchronous flash memory device in accordance with one embodiment of the invention;

FIG. 5 is a timing diagram showing the logical level of signals upon initiation of a burst read operation of the memory device of FIG. 2a;

FIG. 6 is a timing diagram illustrating the timing of consecutive read burst operations of the memory device of FIG. 2a;

FIG. 7 is a timing diagram illustrating random read accesses within a page of the memory device of FIG. 2a.

DETAILED DESCRIPTION OF A SPECIFIC EMBODIMENT OF THE INVENTION

Figure 1A:
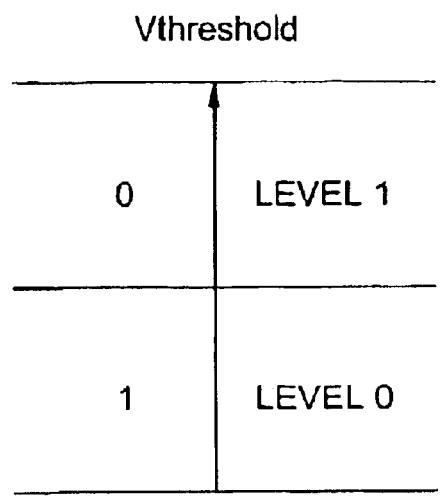
FIG. 1a illustrates the cell data map for a conventional flash memory cell.
Figure 1B:
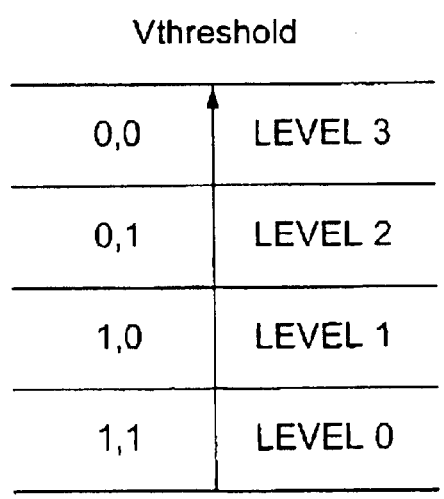
FIG. 1b illustrates the cell data map for a multi-level memory cell.

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Furthermore, for the purposes of the present disclosure, the terms "comprise" and "comprising" shall be interpreted in an inclusive, non-limiting sense, recognizing that an element or method step said to "comprise" one or more specific components may include additional components. Also, it is to be understood that the terms "coupled" and "coupled to" as used to describe the interrelationship of two recited elements shall be interpreted so as to not exclude the possibility of intermediate elements disposed between the recited elements. That is, a first element may be "coupled to" a second element indirectly by means of one or more additional elements (for example (without limitation), a resistor, a transistor, or an inverter, and the terms "coupled" and "coupled to" shall necessarily not be interpreted as either implying or excluding being "coupled directly" or "coupled directly to." Such a distinction is especially relevant in situations where a first element is "selectively" coupled to a second element, for example through the source-to-drain path of a transistor, or where a logic signal passes through an even number of inverters.

Referring to FIG. 2a, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128. Command execution logic 130 is provided to control the basic operations of the memory device. A state machine 132 is also provided to control specific operations performed on the memory arrays and cells. A status register 134 and an identification register 136 can also be provided to output data.

In accordance with a significant aspect of the present invention, memory cells 102 are multi-level or multi-bit flash memory cells each capable of storing more than one bit of information. Each time an individual multi-level flash memory cell is sensed, more than one bit of data is obtained. Thus, for example, in a memory organized for storing sixteen-bit words (a "by-sixteen" or "x16" part), only eight memory cells are needed to store each word.

As noted above, potential disadvantage of using multi-level flash memory cells is the inherent slowness in sensing multi-level flash memory cells as compared with conventional one-bit flash memory cells. However, as will be hereinafter described in greater detail, the effects of this slowness can be substantially minimized, particularly when performing burst read operations.

Figure 2B:
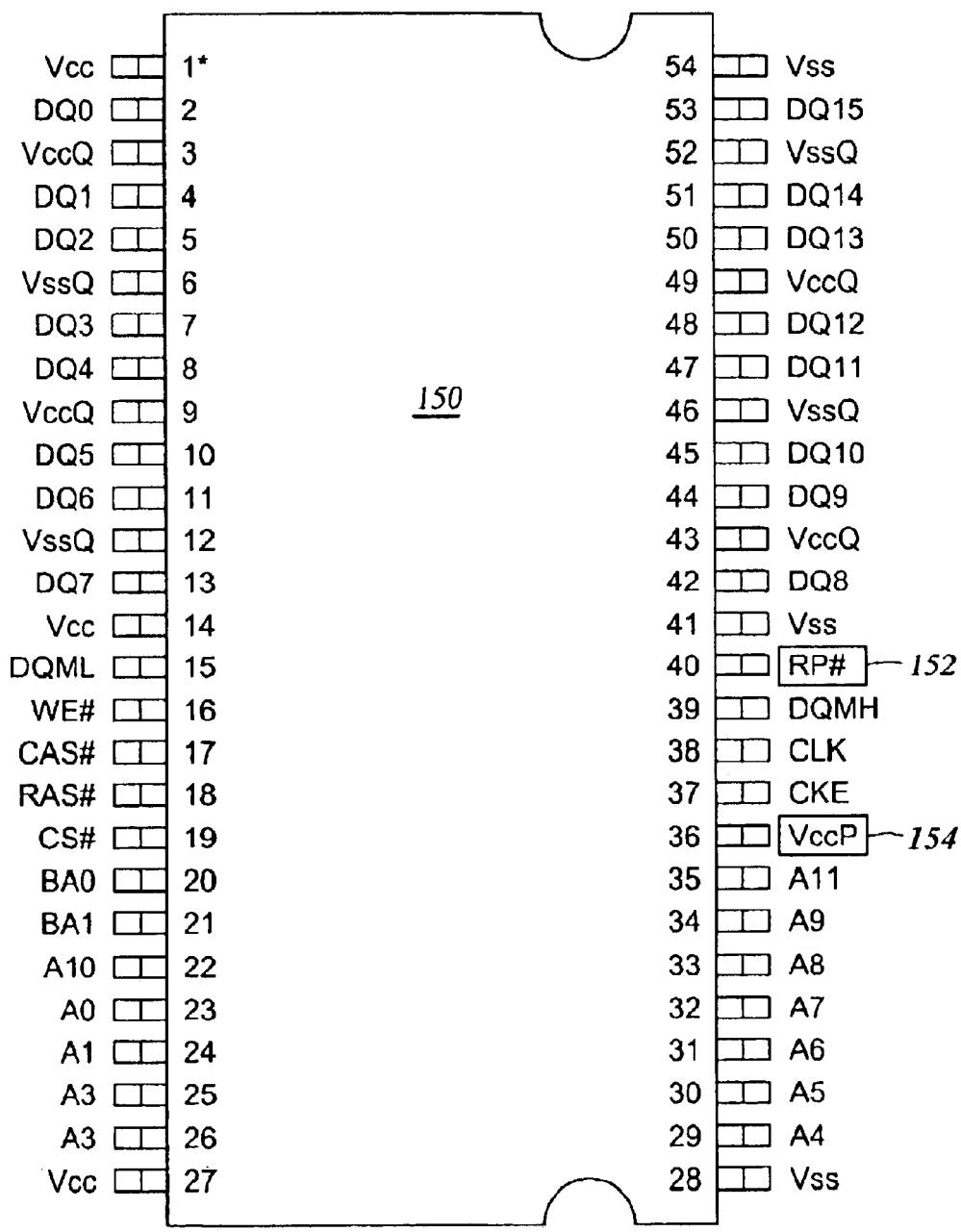
FIG. 2b is an integrated circuit pin interconnect diagram for one embodiment of the invention.
Figure 2C:
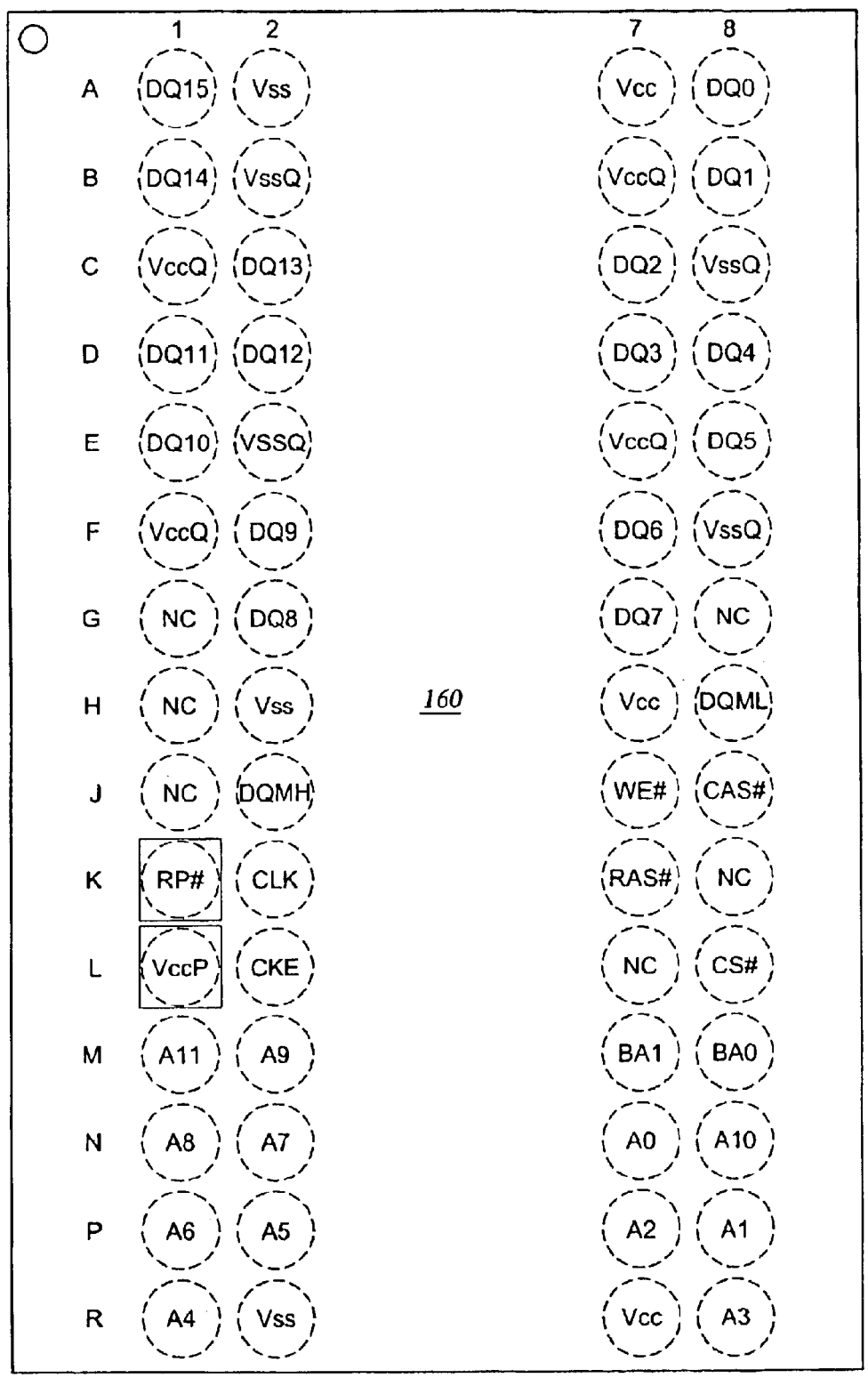
FIG. 2c is an integrated circuit interconnection bump grid array diagram of an alternative embodiment of the invention.

FIG. 2b illustrates an interconnect pin assignment of one embodiment of the present invention. The memory package 150 has 54 interconnect pins. The pin configuration is substantially similar to commercially-available SDRAM packages. Two interconnects specific to the flash memory device present invention are RP# 152 and Vccp 154. Although the present invention may share interconnect labels that are appear the same as SDRAM's, the function of the signals provided on the interconnects are described herein and should not be equated to SDRAM's unless set forth herein. FIG. 1C illustrates one embodiment of a memory package 160 that has bump connections instead of the pin connections of FIG. 2c The present invention, therefore, is not limited to a specific package configuration.

Prior to describing the operational features of the memory device, a more detailed description of the interconnect pins and their respective signals is provided. The input clock connection is used to provide a clock signal (CLK). The clock signal can be driven by a system clock, and all synchronous flash memory input signals are sampled on the positive edge of CLK. CLK also increments an internal burst counter and controls the output registers.

The input clock enable (CKE) connection is used to activate (HIGH state) and deactivates (LOW state) the CLK signal input. Deactivating the clock input provides POWER-DOWN and STANDBY operation (where all memory banks are idle), ACTIVE POWER-DOWN (a memory row is ACTIVE in either bank) or CLOCK SUSPEND operation (burst/access in progress). CKE is synchronous except after the device enters power-down modes, where CKE becomes asynchronous until after exiting the same mode. The input buffers, including CLK, are disabled during power-down modes to provide low standby power. CKE may be tied HIGH in systems where power-down modes (other than RP# deep power-down) are not required.

The chip select (CS#) input connection provides a signal to enable (registered LOW) and disable (registered HIGH) a command decoder provided in the command execution logic. All commands are masked when CS# is registered HIGH. Further, CS# provides for external bank selection on systems with multiple banks, and CS# can be considered part of the command code; but may not be necessary.

The input command input connections for RAS#, CAS#, and WE# (along with CAS#, CS#) define a command that is to be executed by the memory, as described in detail below. The input/output mask (DQM) connections are used to provide input mask signals for write accesses and an output enable signal for read accesses. Input data is masked when DQM is sampled HIGH during a WRITE cycle. The output buffers are placed in a high impedance (High-Z) state (after a two-clock latency) when DQM is sampled HIGH during a READ cycle. DQML corresponds to data connections DQ0–DQ7 and DQMH corresponds to data connections DQ8–DQ15. DQML and DQMH are considered to be the same state when referenced as DQM.

Address inputs 133 are primarily used to provide address signals. In the illustrated embodiment the memory has 12 lines (A0–A11). Other signals can be provided on the address connections, as described below. The address inputs are sampled during an ACTIVE command (row-address A0–A11) and a READ/WRITE command (column-address A0–A7) to select one location in a respective memory bank. The address inputs are also used to provide an operating code (OpCode) during a LOAD COMMAND REGISTER operation, explained below. Address lines A0–A11 are also used to input mode settings during a LOAD MODE REGISTER operation.

An input reset/power-down (RP#) connection 140 is used for reset and power-down operations. Upon initial device power-up, a 100 µs delay after RP# has transitioned from LOW to HIGH is required in one embodiment for internal device initialization, prior to issuing an executable command. The RP# signal clears the status register, sets the internal state machine (ISM) 132 to an array read mode, and places the device in a deep power-down mode when LOW. During power down, all input connections, including CS# 142, are "Don't Care" and all outputs are placed in a High-Z state. When the RP# signal is equal to a VHH voltage (5V), all protection modes are ignored during WRITE and ERASE. The RP# signal also allows a device protect bit to be set to 1 (protected) and allows block protect bits of a 16 bit register, at locations 0 and 15 to be set to 0 (unprotected) when brought to VHH. The protect bits are described in more detail below. RP# is held HIGH during all other modes of operation.

Bank address input connections, BA0 and BA1 define which bank an ACTIVE, READ, WRITE, or BLOCK PROTECT command is being applied. The DQ0–DQ15 connections 143 are data bus connections used for bi-directional data communication. Referring to FIG. 2b, a VCCQ connection is used to provide isolated power to the DQ connections to improved noise immunity. In one embodiment, VCCQ=Vcc or 1.8V±0.15V. The VSSQ connection is used to isolated ground to DQs for improved noise immunity. The VCC connection provides a power supply, such as 3V. A ground connection is provided through the Vss connection. Another optional voltage is provided on the VCCP connection 144. The VCCP connection can be tied externally to VCC, and sources current during device initialization, WRITE and ERASE operations. That is, writing or erasing to the memory device can be performed using a VCCP voltage, while all other operations can be performed with a VCC voltage. The Vccp connection is coupled to a high voltage switch/pump circuit 145.

In one embodiment, the invention comprises a nonvolatile, electrically sector-erasable (flash), programmable read-only memory containing 33,554,432 multi-level memory cells functionally organized as 4,194,304 words by 16 bits. Other population densities are contemplated, and the present invention is not limited to the example density. Each memory bank is organized into four independently erasable blocks (16 total). To ensure that critical firmware is protected from accidental erasure or overwrite, the memory can include sixteen 512K-word hardware and software lockable blocks. The memory's four-bank architecture supports true concurrent operations.

A read access to any bank can occur simultaneously with a background WRITE or ERASE operation to any other bank. The synchronous flash memory has a synchronous interface (all signals are registered on the positive edge of the clock signal, CLK). Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

The synchronous flash memory provides for programmable read burst lengths of 1, 2, 4 or 8 locations, or the full page, with a burst terminate option. Further, the synchronous flash memory uses an internal pipelined architecture to achieve high-speed operation. Advantageously, and in accordance with one embodiment of the invention, because multi-level flash memory cells are used, fewer cells are needed to achieve the same overall storage capacity. In particular, for a memory device incorporating two-bit flash memory cells, one-half the number of cells would be required as compared with a memory using single-bit memory cells.

The synchronous flash memory can operate in low-power memory systems, such as systems operating on three volts. A deep power-down mode is provided, along with a power-saving standby mode. All inputs and outputs are low voltage transistor-transistor logic (LVTTL) compatible. The synchronous flash memory offers substantial advances in Flash operating performance, including the ability to synchronously burst data at a high data rate with automatic column address generation and the capability to randomly change column addresses on each clock cycle during a burst access.

In general, the synchronous flash memory is configured similar to a multi-bank DRAM that operates at low voltage and includes a synchronous interface. Each of the banks is organized into rows and columns. Prior to normal operation, the synchronous flash memory is initialized. The following sections provide detailed information covering device initialization, register definition, command descriptions and device operation.

The synchronous flash is powered up and initialized in a predefined manner. After power is applied to VCC, VCCQ and VCCP (simultaneously), and the clock signal is stable, RP# 140 is brought from a LOW state to a HIGH state. A delay, such as a 100 $\mu$Sec delay, is needed after RP# transitions HIGH in order to complete internal device initialization. After the delay time has passed, the memory is placed in an array read mode and is ready for Mode Register programming or an executable command. After initial programming of a non-volatile mode register 147 (NVMode Register), the contents are automatically loaded into a volatile Mode Register 148 during the initialization. The device will power up in a programmed state and will not require reloading of the non-volatile mode register 147 prior to issuing operational commands. This is explained in greater detail below.

The Mode Register 148 is used to define the specific mode of operation of the synchronous flash memory. This definition includes the selection of a burst length, a burst type, a CAS latency, and an operating mode. The Mode Register is programmed via a LOAD MODE REGISTER command and retains stored information until it is reprogrammed. The contents of the Mode Register may be copied into the NVMode Register 147. The NVMode Register settings automatically load the Mode Register 148 during initialization. Details on ERASE NVMODE REGISTER and WRITE NVMODE REGISTER command sequences are provided below. Those skilled in the art will recognize that an SDRAM requires that a mode register must be externally loaded during each initialization operation. The present invention allows a default mode to be stored in the NV mode register 147. The contents of the NV mode register are then copied into a volatile mode register 148 for access during memory operations.

Mode Register bits M0–M2 specify a burst length, M3 specifies a burst type (sequential or interleaved), M4–M6 specify a CAS latency, M7 and M8 specify a operating mode, M9 is set to one, and M10 and M11 are reserved in this embodiment. Because WRITE bursts are not currently implemented, M9 is set to a logic one and write accesses are single location (non-burst) accesses. The Mode Register must be loaded when all banks are idle, and the controller must wait the specified time before initiating a subsequent operation.

Read accesses to the synchronous flash memory can be burst oriented, with the burst length being programmable, as shown in Table 1. The burst length determines the maximum number of column locations that can be automatically accessed for a given READ command. Burst lengths of 1, 2, 4, or 8 locations (words) are available for both sequential and the interleaved burst types, and a full-page burst is available for the sequential type. The full-page burst can be used in conjunction with the BURST TERMINATE command to generate arbitrary burst lengths that is, a burst can be selectively terminated to provide custom length bursts. When a READ command is issued, a block of columns equal to the burst length is effectively selected. All accesses for that burst take place within this block, meaning that the burst will wrap within the block if a boundary is reached. The block is uniquely selected by A1–A7 when the burst length is set to two, by A2–A7 when the burst length is set to four, and by A3–A7 when the burst length is set to eight. The remaining (least significant) address bit(s) are used to select the starting location within the block. Full-page bursts wrap within the page if the boundary is reached.

Accesses within a given burst may be programmed to be either sequential or interleaved; this is referred to as the burst type and is selected via bit M3. The ordering of accesses within a burst is determined by the burst length, the burst type and the starting column address, as shown in Table 1.

TABLE 1

BURST DEFINITION

| BURST LENGTH | STARTING COLUMN ADDRESS | | | ORDER OF ACCESSES WITHIN A BURST | |
|---|---|---|---|---|---|
| | | | | TYPE = SEQUENTIAL | TYPE = INTERLEAVED |
| 2 | | | A0 | | |
| | | | 0 | 0-1 | 0-1 |
| | | | 1 | 1-0 | 1-0 |
| 4 | | A1 | A0 | | |
| | | 0 | 0 | 0-1-2-3 | 0-1-2-3 |
| | | 0 | 1 | 1-2-3-0 | 1-2-3-0 |
| | | 1 | 0 | 2-3-0-1 | 2-3-0-1 |
| | | 1 | 1 | 3-0-1-2 | 3-0-1-2 |
| | A2 | A1 | A0 | | |
| | 0 | 0 | 0 | 0-1-2-3-4-5-6-7 | 0-1-2-3-4-5-6-7 |
| | 0 | 0 | 1 | 1-2-3-4-5-6-7-0 | 1-2-3-4-5-6-7-0 |
| | 0 | 1 | 0 | 2-3-4-5-6-7-0-1 | 2-3-4-5-6-7-0-1 |
| | 0 | 1 | 1 | 3-4-5-6-7-0-1-2 | 3-4-5-6-7-0-1-2 |
| | 1 | 0 | 0 | 4-5-6-7-0-1-2-3 | 4-5-6-7-0-1-2-3 |
| | 1 | 0 | 1 | 5-6-7-0-1-2-3-4 | 5-6-7-0-1-2-3-4 |
| | 1 | 1 | 0 | 6-7-0-1-2-3-4-5 | 6-7-0-1-2-3-4-5 |
| | 1 | 1 | 1 | 7-0-1-2-3-4-5-6 | 7-0-1-2-3-4-5-6 |

TABLE 1-continued

BURST DEFINITION

| BURST LENGTH | STARTING COLUMN ADDRESS | ORDER OF ACCESSES WITHIN A BURST | |
|---|---|---|---|
| | | TYPE = SEQUENTIAL | TYPE = INTERLEAVED |
| Full Page 256 | n = A0–A7 (location 0–255) | Cn, Cn + 1, Cn + 2 Cn + 3, Cn + 4 . . . Cn-1, Cn . . . | Not Supported |

Column Address Strobe (CAS) latency is a delay, in clock cycles, between the registration of a READ command and the availability of the first piece of output data on the DQ connections. The latency can be set to one, two or three clocks cycles. For example, if a READ command is registered at clock edge n, and the latency is m clocks, the data will be available by clock edge n+m. The DQ connections will start driving data as a result of the clock edge one cycle earlier (n+m−1) and, provided that the relevant access times are met, the data will be valid by clock edge n+m. For example, assuming that the clock cycle time is such that all relevant access times are met, if a READ command is registered at T0, and the latency is programmed to two clocks, the DQs will start driving after T1 and the data will be valid by T2. The normal operating mode is selected by setting M7 and M8 to zero, and the programmed burst length applies to READ bursts.

The following truth tables summarize generally the operation commands of an embodiment of the memory of the present invention. A more detailed description of the operation commands is provided in the above-referenced Roohparvar '049 patent.

TRUTH TABLE 1

Interface Commands and DQM Operation

| NAME (FUNCTION) | CS # | RAS # | CAS # | WE # | DQM | ADDR | DQs |
|---|---|---|---|---|---|---|---|
| COMMAND INHIBIT | H (NOP) | X | X | X | X | X | X |
| NO OPERATION (NOP) | L | H | H | H | X | X | X |
| ACTIVE (Select bank and activate row) | L | L | H | H | X | Bank/Row | X |
| READ (Select bank, column, and start READ burst) | L | H | L | H | X | Bank/Col | X |
| WRITE (Select bank, column, and start WRITE) | L | H | L | L | X | Bank/Col | Valid |
| BURST TERMINATE | L | H | H | L | X | X | Active |
| ACTIVE TERMINATE | L | L | H | L | X | X | X |
| LOAD COMMAND REGISTER | L Code | L | L | H | X | Com Code | X |
| LOAD MODE REGISTER | MODE Code | L | L | L | L | Op Code | X |
| Write Enable/Output | — | — | — | — | L | — | Active |
| Write Inhibit/Output High-Z | — | — | — | — | H | — | High-Z |

TRUTH TABLE 2

Flash Memory Command Sequences

| | 1st Cycle | | | | 2nd Cycle | | | | | 3rd Cycle | | | | |
|---|---|---|---|---|---|---|---|---|---|---|---|---|---|---|
| Operation | CMD | ADDR | ADDR | DQ | RP# | CMD | ADDR | ADDR | DQ | RP# | CMD | ADDR | ADDR | DQ | RP# |
| READ DEVICE Config | LCR | 90H | Bank | X | H | ACTIVE | Row | Bank | X | H | READ | CA | Bank | X | H |
| READ Status Register | LCR | 70H | X | X | H | ACTIVE | X | X | X | H | READ | X | X | X | H |
| CLEAR Status Register | LCR | 50H | X | X | H | | | | | | | | | | |
| ERASE SETUP/Confirm | LCR | 20H | Bank | X | H | ACTIVE | Row | Bank | X | H | WRITE | X | Bank | D0H | H/$V_{HH}$ |
| WRITE SETUP/WRITE | LCR | 40H | Bank | X | H | ACTIVE | Row | Bank | X | H | WRITE | Col | Bank | DIN | H/$V_{HH}$ |
| Protect BLOCK/Confirm | LCR | 60H | Bank | X | H | ACTIVE | Row | Bank | X | H | WRITE | X | Bank | 01H | H/$V_{HH}$ |
| Protect DEVICE/\Confirm | LCR | 60H | Bank | X | H | ACTIVE | X | Bank | X | H | WRITE | X | Bank | F1H | $V_{HH}$ |
| Unprotect BLOCKS/Confirm | LCR | 60H | Bank | X | H | ACTIVE | X | Bank | X | H | WRITE | X | Bank | D0H | H/$V_{HH}$ |
| ERASE NVmode Register | LCR | 30H | Bank | X | H | ACTIVE | X | Bank | X | H | WRITE | X | Bank | C0H | H |
| WRITE NVmode Register | LCR | A0H | Bank | X | H | ACTIVE | X | Bank | X | H | WRITE | X | Bank | X | H |

Figure 6:

READ bursts are initiated with a READ command (defined by CS#, WE#, RAS#, CAS#). The starting column and bank addresses are provided with the READ command. During READ bursts, the valid data-out element from the starting column address will be available following the CAS latency after the READ command. Each subsequent data-out element will be valid by the next positive clock edge. Upon completion of a burst, assuming no other commands have been initiated, the DQs will go to a High-Z state. A full page burst will continue until terminated. (At the end of the page, it will wrap to column 0 of the same page and continue.) Data from any READ burst may be truncated with a subsequent READ command, and data from a fixed-length READ burst may be immediately followed by data from a subsequent READ command. In either case, a continuous flow of data can be maintained. The first data element from the new burst follows either the last element of a completed burst, or the last desired data element of a longer burst that is being truncated. The new READ command should be issued x cycles before the clock edge at which the last desired data element is valid, where x equals the CAS latency minus one. This is shown in FIG. 6 for CAS latencies of one, two and three; data element n+3 is either the last of a burst of four, or the last desired of a longer burst. The synchronous flash memory uses a pipelined architecture and therefore does not require the 2 n rule associated with a prefetch architecture. A READ command can be initiated on any clock cycle following a previous READ command. Full-speed, random read accesses within a page can be performed as shown in FIG. 6, or each subsequent READ may be performed to a different bank.

Data from any READ burst may be truncated with a subsequent WRITE command (WRITE commands must be preceded by WRITE SETUP), and data from a fixed-length READ burst may be immediately followed by data from a subsequent WRITE command (subject to bus turnaround limitations). The WRITE may be initiated on the clock edge immediately following the last (or last desired) data element from the READ burst, provided that I/O contention can be avoided. In a given system design, there may be the possibility that the device driving the input data would go Low-Z before the synchronous flash memory DQs go High-Z. In this case, at least a single-cycle delay should occur between the last read data and the WRITE command.

Figure 7:
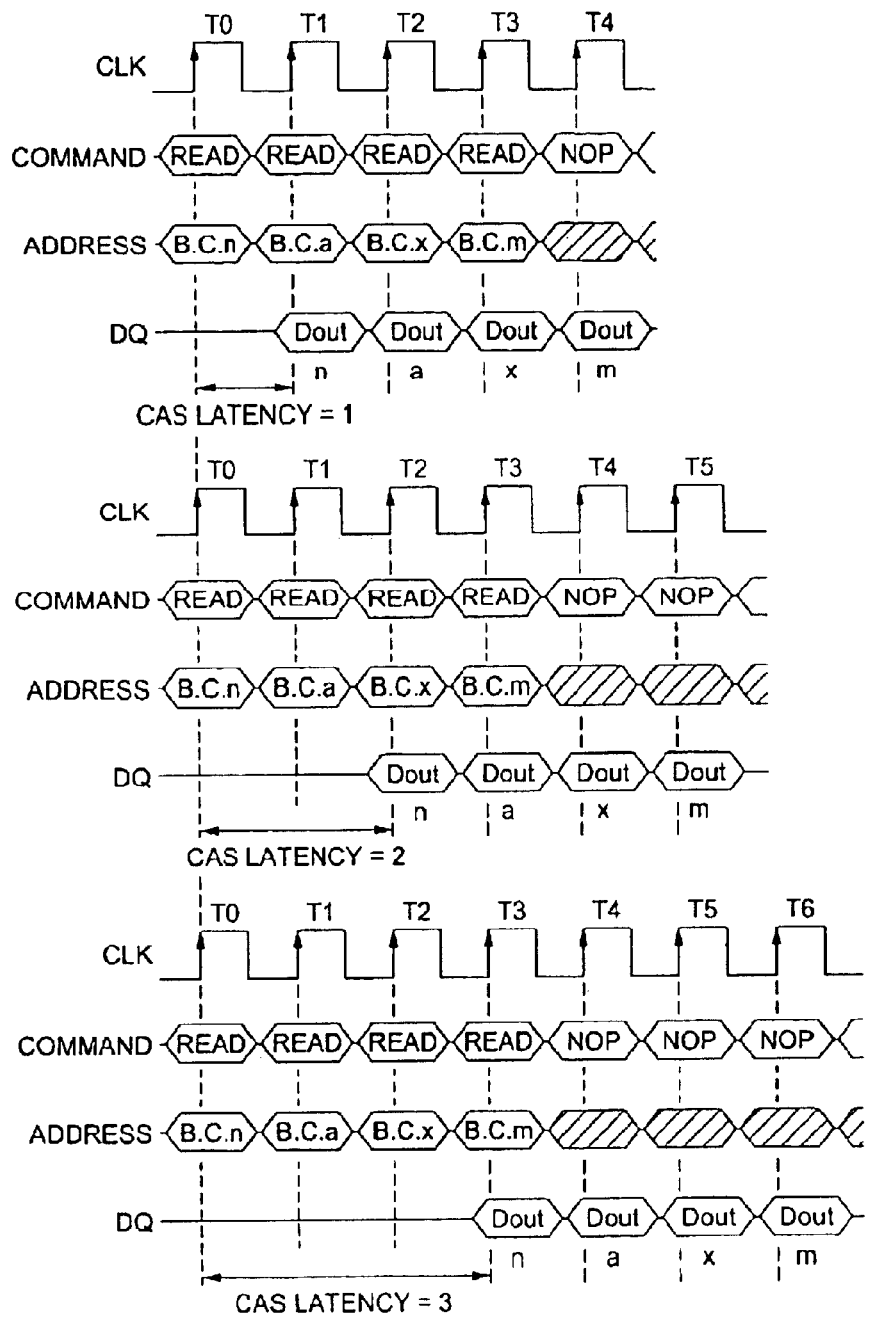
Figure 8:
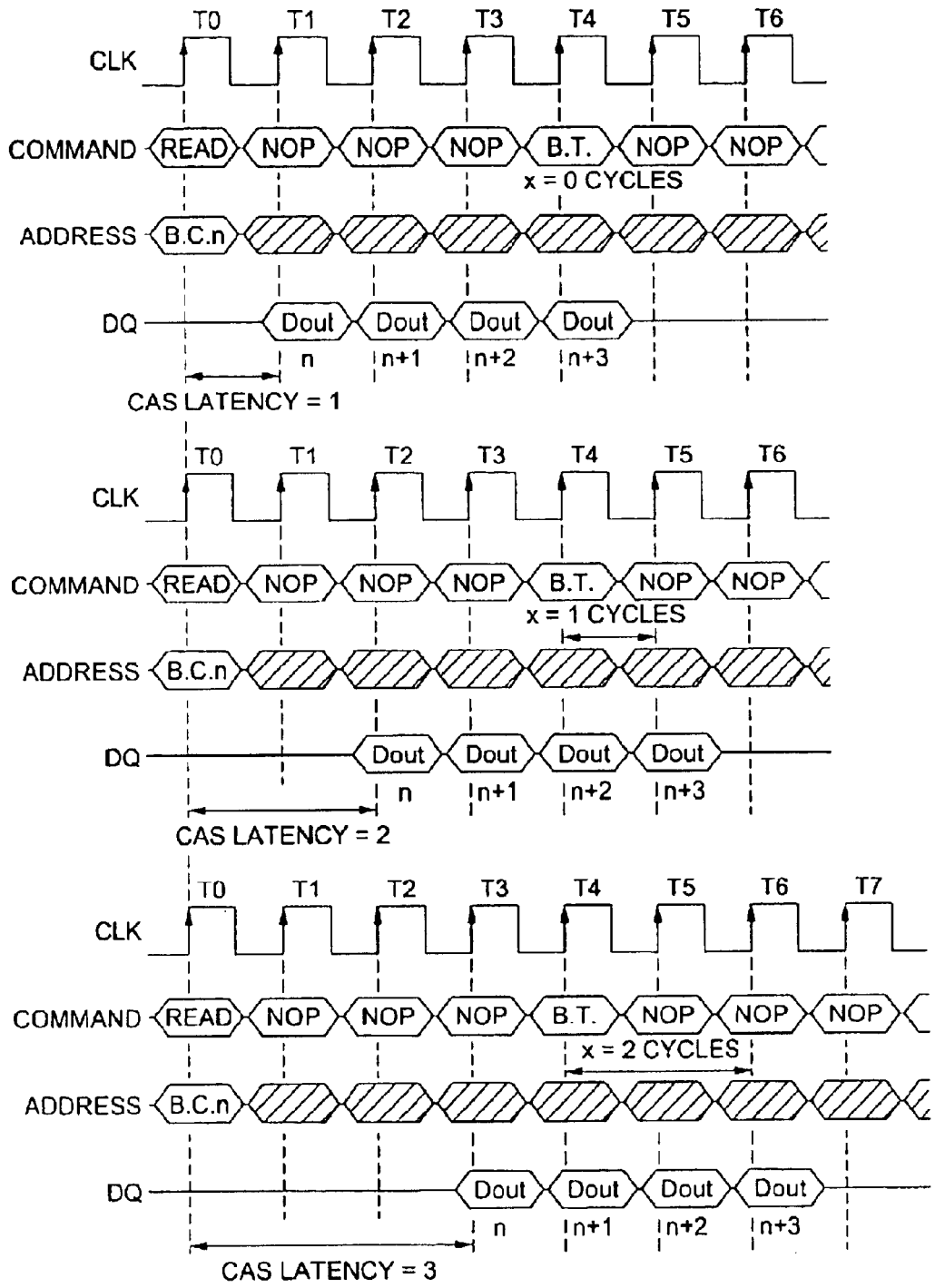
FIG. 8 is a timing diagram illustrating a burst read operation that is terminated using a burst terminate command according to one embodiment of the invention.

A fixed-length or full-page READ burst can be truncated with either ACTIVE TERMINATE (may or may not be bank specific) or BURST TERMINATE (not bank specific) commands. The ACTIVE TERMINATE or BURST TERMINATE command should be issued x cycles before the clock edge at which the last desired data element is valid, where x equals the CAS latency minus one. This is shown in FIG. 7 for each possible CAS latency; data element n+3 is the last desired data element of a burst of four or the last desired of a longer burst.

It is believed that further detail as to the functional operation of memory device 100 in accordance with the presently disclosed embodiment of the invention is not necessary for an understanding of the present invention. It is sufficient to clarify that memory 100 operates substantially as described in the aforementioned U.S. Pat. No. 6,314,049.

The '049 patent can be characterized generally as describing a non-volatile synchronous flash memory that, notably, is compatible with existing SDRAM package pin assignments and control signal definition and timing specifications. To achieve this, the memory described in the '049 patent utilizes command execution logic which serves as a translator between the externally-applied SDRAM control signals and the internal flash memory. Thus, for example, whereas conventional flash memory accesses involve assertion of an ACTIVE signal to select a desired memory bank and activate a row, and a subsequent assertion of a READ signal to select columns within the selected row, the memory in the '049 patent translates such functionality into a RAS and CAS operational model. Under such a model, the RAS cycle corresponds generally into the ACTIVE portion of the flash memory access cycle, while the CAS cycle corresponds generally to the READ portion of the flash memory access cycle. The present invention builds upon the concepts of the '049 patent by further introducing the concept of utilizing multi-bit memory cells into the flash memory, while continuing to maintain the SDRAM interface to the outside world.

Figure 3:
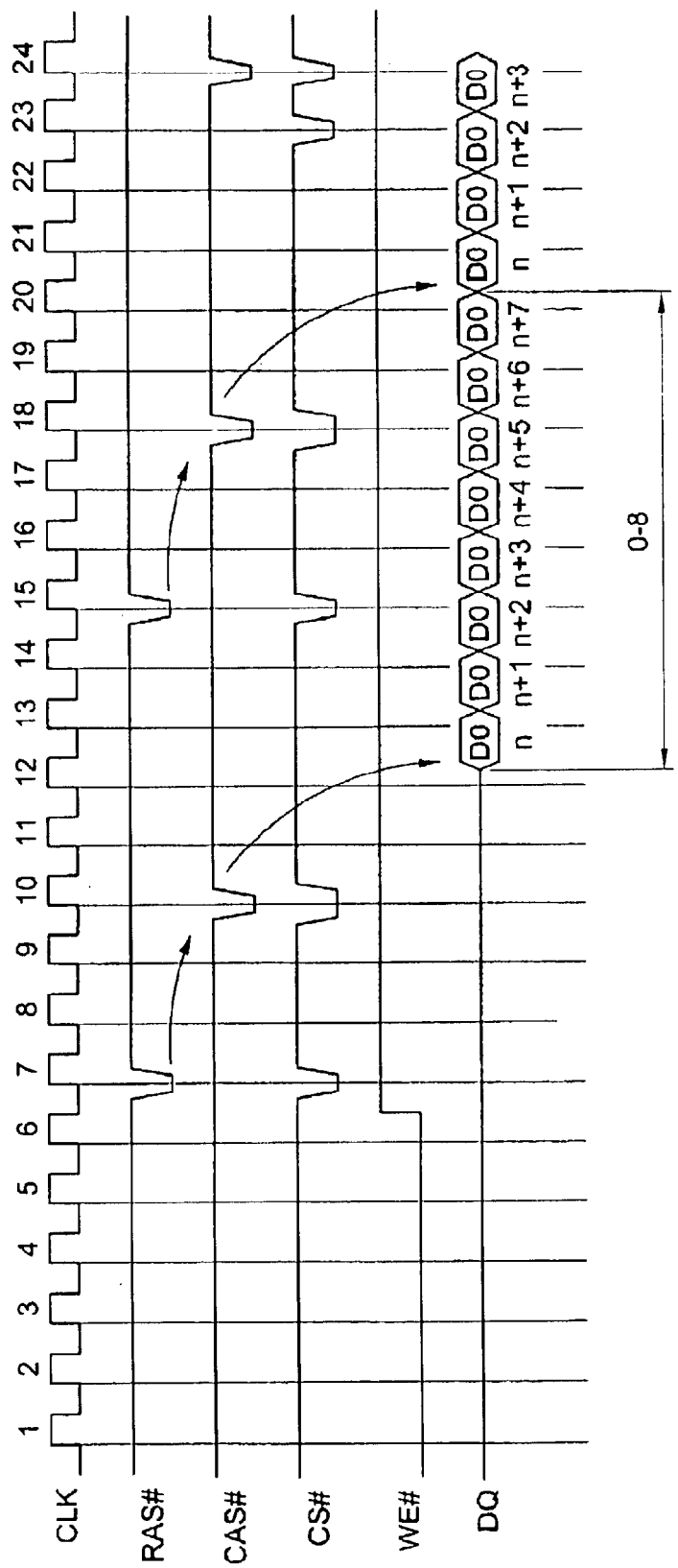
FIG. 3 is a timing diagram for burst read operations for a memory device having conventional flash memory cells.
Figure 4:
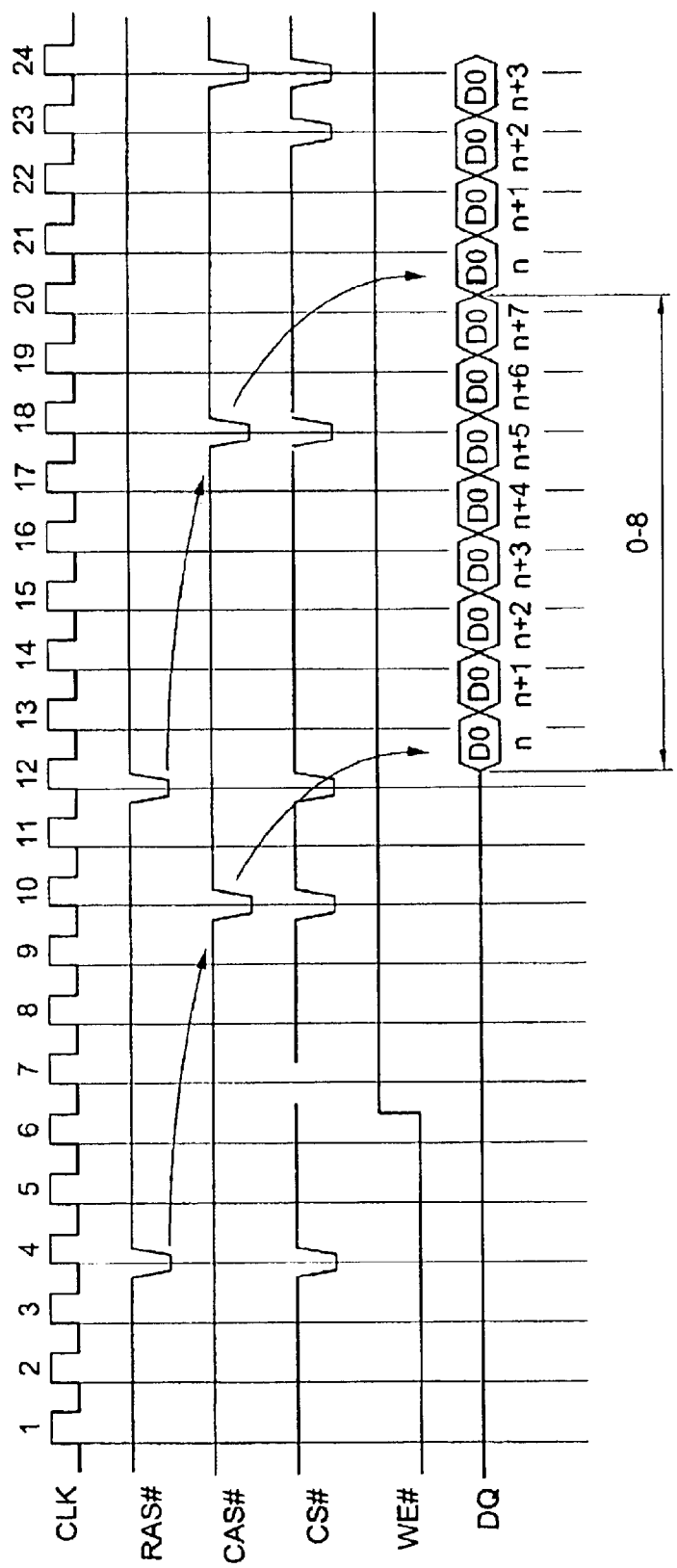
FIG. 4 is a timing diagram for burst read operations performed by the memory device of FIG. 2a having multi-bit memory cells.
Figure 5:
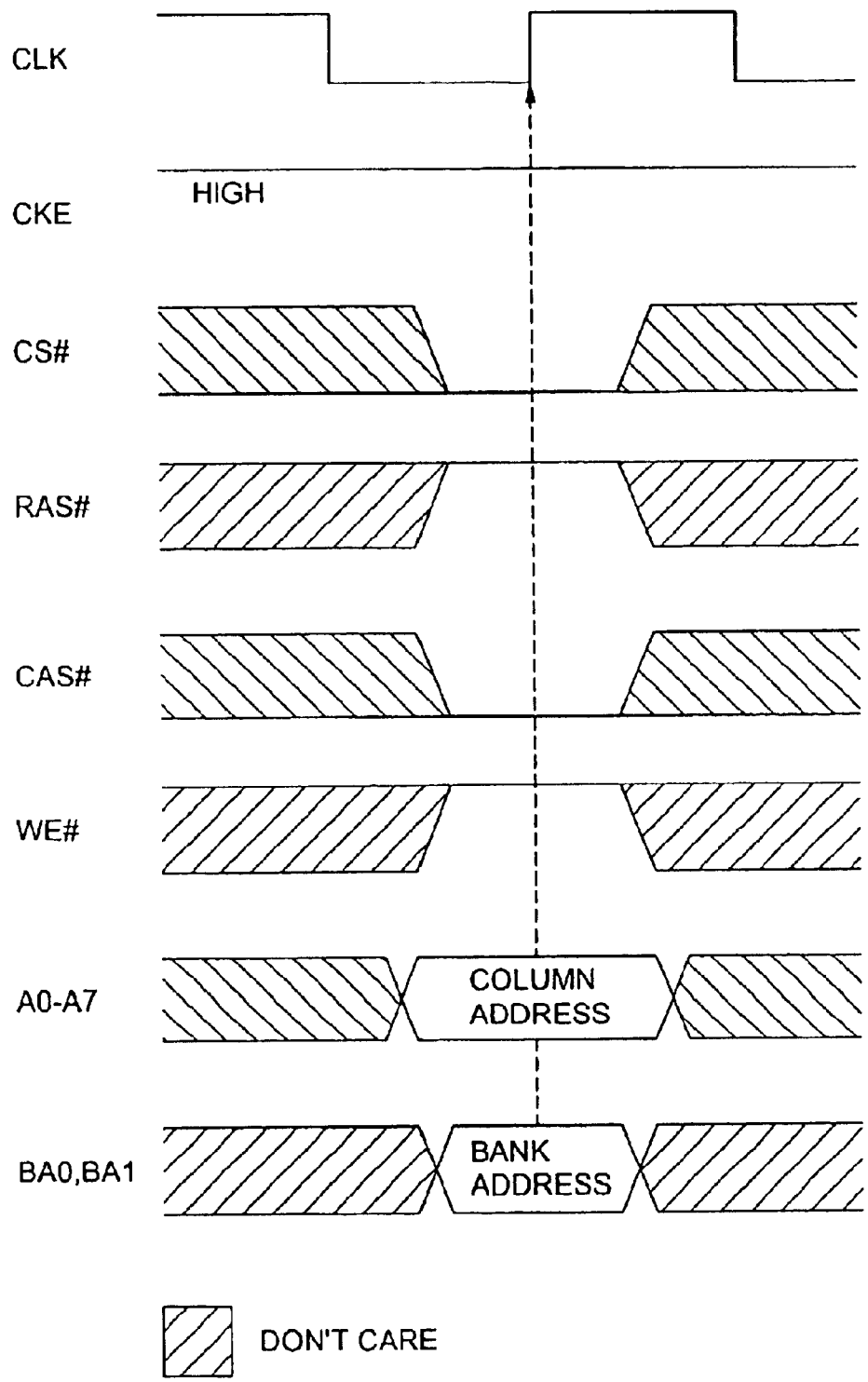

Turning now to FIGS. 3 and 4, there are shown timing diagrams comparing burst read operations performed by prior art flash memory devices having one bit-per-cell flash cells and memory devices in accordance with one embodiment of the present invention, having two (or more) bits-per-cell flash memory cells. As shown in FIG. 3, operation of the memory devices is controlled by a system clock CLK, and in particular, operation is coordinated with rising edges of the CLK signal. In the example shown in FIG. 3, the CLK signal may be, for example, a 50 Mhz clock having a cycle length of 20 nSec.

As with a flash memory device as disclosed in the '049 patent, a burst read operation is initiated by assertion (low) of an ACTIVE signal followed by assertion of a READ signal while a write enable (WE#) signal is held unasserted (high). Following assertion of the ACTIVE signal, there is a first latency period which must elapse before the READ signal can be asserted, and there is a second latency period which elapses after assertion of the READ signal before valid output data words begin to appear on the data output (DQ) pins of the device. These first and second latency periods are collectively referred to as the read latency of the device.

In FIG. 3, signal DQ represents the output from a typical one-bit-per-cell flash memory device. The read latency following a READ command (assertion of the row address strobe or RAS signal) for this device is six clock cycles. After this latency, a valid data word is available on the DQ output pins for each subsequent cycle for the duration of the data burst, which in the exemplary embodiment of FIG. 3 is programmed to a burst length of eight. After the data burst, another burst read operation can be initiated by again asserting RAS. Another burst of data words appears on the DQ output terminals following the latency.

On the other hand, output signal DQ depicted in FIG. 4 represents the output of a flash memory device in accordance with one embodiment of the invention incorporating two-bit-per-cell flash memory cells. In this case, the read latency following assertion of the RAS signal to initiate a burst read operation is nine, rather than six cycles, reflecting the longer time necessary to sense multi-bit flash memory cells as discussed in detail above. As can be seen in FIG. 4, there is a longer latency only before the first of a sequence of successive burst read accesses; the longer latency for subsequent accesses is effectively "masked" through assertion of the RAS and CAS signals at the appropriate times during the previous burst write command. Apart from this initial latency, memory device 100 employs an architecture for enabling device 100 to behave as though it were a conventional synchronous DRAM, i.e., it is responsive to assertion of RAS and CAS signals to initiate read and write operations and conforms to the industry standard pin-out definitions for synchronous DRAMs.

As discussed above with reference to FIGS. 2a and 6, a burst read cycle is initiated through issuance of a READ command. In accordance with one embodiment of the invention, issuance of a READ command causes an entire row, or page, of memory cells to be sensed and latched in the read data latch circuitry within circuit 124 shown in FIG. 2. In one embodiment, a row of cells comprises 2048 multi-level cells. The location within the row at which the read burst begins is specified by the column address applied to the address inputs upon assertion of the CAS signal.

In the exemplary embodiment of FIG. 4, memory device 100 is programmed to a burst length of eight. Data is first available on the DQ output pins following a latency period, which in the embodiment of FIG. 4 is nine clock cycles. However, consecutive words are available on each clock cycle thereafter, since the READ command causes the entire row to be latched at once.

As those of ordinary skill in the art having the benefit of this disclosure will appreciate, the pipelined RAS/CAS architecture of memory device 100 is such that the inherent slower speed of the sense amplifier detect cycle for multi-bit flash memory cells can be effectively "hidden" for all but the first access in a burst read. Though the initial access to a page of multi-bit flash cells is slower due to the sense amplifiers resolving smaller voltage levels, once the voltage levels for an entire page are sensed and latched, a flash memory device employing multi-bit flash memory cells can burst at the same performance (for the latched page) as a device utilizing one-bit-per-cell flash memory cells.

By using a pipelined RAS/CAS architecture such as shown in FIG. 2a, the initial access will become less significant because subsequent accesses are initiated in the background while the current burst operation is taking place. The result is that the initial single access will be slower, as is typical of multi-bit flash memory cells, but the delay in subsequent accesses can be hidden due to the RAS/CAS architecture.

From the foregoing detailed description of a specific embodiment of the invention, it should be apparent that a flash memory device incorporating multi-bit-per-cell flash memory cells has been disclosed. In accordance with one aspect of the invention, the memory device employs a RAS/CAS architecture enabling the device to operate in accordance with the timing and signal specifications of a conventional synchronous DRAM, while at the same time offering the advantage of non-volatility of flash memory devices.

Although a specific embodiment of the invention has been disclosed herein in some detail, it is to be understood that this has been done solely to illustrate various features and aspects of the present invention, and is not intended to be limiting with respect to the scope of the invention as defined in the appended claims, which follow. It is contemplated that various substitutions, alterations, and/or modifications, including but not limited to those design alternatives that may have been specifically discussed herein, may be made to the disclosed embodiment(s) without departing from the spirit and scope of the invention as defined in the claims.

For example, the present invention has been described herein in the context of a memory device having a particular capacity and operating at a particular clock speed. Those of ordinary skill in the art will understand that the invention is by no means limited to these specific operational parameters or design considerations, and further that the present invention may be advantageously practiced in the context of a wide variety of different RAS/CAS or pipelined memory architectures.

What is claimed is:

1. A semiconductor memory device, comprising:

an array of rows and columns of multi-level flash memory cells selectively programmable to have one of a plurality of different threshold voltages, each row of said flash memory cells being organized into a plurality of multi-bit words;

row address decoding circuitry coupled to said array, for selecting a row of said flash memory cells in response to a plurality of decoded row address signals;

column address decoding circuitry coupled to said array, for selecting columns of flash memory cells in selected rows of flash memory cells;

sensing circuitry, coupled to said array, for sensing said threshold voltage of each flash memory cell in said selected row and translating each sensed threshold voltage to a multi-bit bit-set of data;

read data latch circuitry, coupled to said sensing circuitry, for latching said each of said multi-bit bit-sets of data; and output circuitry, coupled to said read data latch circuitry, for outputting said latched data.

2. A semiconductor memory device in accordance with claim 1, wherein said memory device operates synchronously with an externally-applied clock signal.

3. A semiconductor memory device in accordance with claim 1, further comprising:

column address decoding circuitry coupled to said array, for selecting a column of flash memory cells in said selected row in response to a plurality of decoded column address signals.

4. A semiconductor memory device in accordance with claim 3, wherein said sensing circuitry senses threshold voltages of all flash memory cells in said selected row at one time.

5. A semiconductor memory device in accordance with claim 4, wherein said memory device is operable in a burst read mode wherein a predetermined number of successive words of data in said selected row are outputted in a first succession beginning with a word corresponding to said selected column.

6. A semiconductor memory device in accordance with claim 5, wherein a predetermined minimum time interval elapses following initiation of a first burst read operation before said output circuitry outputs said word corresponding to said selected column.

7. A semiconductor memory device in accordance with claim 6, wherein a second burst read operation is initiated before said predetermined number of successive words of data are outputted during said first burst read operation.

8. A semiconductor memory device in accordance with claim 7, wherein initiation of said second burst read operation causes said output circuitry to output a second succession of data beginning less than said predetermined minimum time interval following completion of said first burst read operation.

9. A semiconductor memory device in accordance with claim 1, wherein said plurality of multi-bit bit sets comprises a plurality of sets of at least two bits.

10. A method of operating a semiconductor memory device comprising an array of rows and columns of flash memory cells, each row organized as a plurality of multi-bit words, comprising:

(a) selectively programming a plurality of said flash memory cells to have a threshold voltage, where different threshold voltages each correspond to different ones of a plurality of multi-bit bit-sets;

(b) in response to initiation a first read command, sensing said threshold voltages on a subset of said plurality of memory cells designated by applied row address signal and translating each sensed threshold voltage into its corresponding one of a plurality of multi-bit bit-sets to obtain a first row of read data, where the number of bits in said first row of read data is an integer multiple of the number of said flash memory cells from which said voltages were sensed;

(c) latching said first row of read data in a latch;

(d) decoding a column address signal applied to said memory; and (e) outputting said first row of read data starting at a column location in said row corresponding to said decoded column address.

11. A method in accordance with claim 10, wherein said integer multiple is greater than two.

12. A method in accordance with claim 10, wherein said plurality of flash memory cells comprises at least a row of said flash memory cells.

13. A method in accordance with claim 12, wherein said step (b) comprises sensing the threshold voltage of each flash memory cell in said at least one row.

14. A method in accordance with claim 13, wherein said step (d) comprises outputting successive ones of said plurality of multi-bit words at a time.

15. A method in accordance with claim 14, wherein said step (d) comprises outputting successive ones of said plurality of multi-bit words at a time in synchronization with a clock signal.

16. A method in accordance with claim 10, wherein said plurality of flash memory cells comprises at least two rows of said flash memory cells.

17. A method in accordance with claim 16, wherein said step (b) comprises sensing the threshold voltage of each flash memory cell in a first one of said at least two rows.

18. A method in accordance with claim 17, wherein said step (d) comprises outputting successive ones of said plurality of multi-bit words at a time in synchronization with a clock signal.

19. A method in accordance with claim 18, further comprising:

(f) in response to a second read command issued during said step (d) of outputting successive ones of said plurality of multi-bit words at a time in synchronization with a clock signal, sensing the threshold voltage of each flash memory cell in a second of said at least two rows of flash memory cells and translating each sensed threshold voltage into its corresponding one of a plurality of multi-bit bit-sets to obtain a second row of read data;

(g) upon completion of said step (d) of outputting said first row of read data, latching said second row of read data in said latch; and (h) outputting the second row of read data at said output of said memory device.

* * * * *

UNITED STATES PATENT AND TRADEMARK OFFICE
CERTIFICATE OF CORRECTION

PATENT NO. : 6,870,774 B2
DATED : March 22, 2005
INVENTOR(S) : Frankie F. Roohparvar et al.

It is certified that error appears in the above-identified patent and that said Letters Patent is hereby corrected as shown below:

Column 16,
Line 5, insert -- of -- after "initiation".
Lines 31, 34, 44, 50 and 58, replace "(d)" with -- (e) --.

Signed and Sealed this

Twenty-fourth Day of May, 2005

JON W. DUDAS
*Director of the United States Patent and Trademark Office*